US012794455B2

(12) United States Patent
Karthykeyan et al.

(10) Patent No.: US 12,794,455 B2
(45) Date of Patent: Nov. 10, 2026

(54) FLIP-FLOP CIRCUIT WITH SELECTIVE CLOCK GATING

(71) Applicant: Advanced Micro Devices, Inc., Santa Clara, CA (US)

(72) Inventors: Kedar Karthykeyan, Santa Clara, CA (US); Huzefa Vohra, Santa Clara, CA (US); Vibhor Mittal, Santa Clara, CA (US); Ashwin Gowda Krishnappa Sowbhagya, Santa Clara, CA (US); Sundararajan Rangarajan, Santa Clara, CA (US); Deepesh John, Santa Clara, CA (US); Teja Singh, Santa Clara, CA (US); Christopher S. Oliver, Santa Clara, CA (US); Tanmayee Guttikonda, Santa Clara, CA (US); Nandini Motganahalli Subramanyam, Santa Clara, CA (US); Vinayak Pramod Kini, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 41 days.

(21) Appl. No.: 19/086,933

(22) Filed: Mar. 21, 2025

(65) Prior Publication Data

US 2026/0291471 A1 Sep. 24, 2026

(51) Int. Cl.
*H03K 3/037* (2006.01)

(52) U.S. Cl.
CPC .................................. *H03K 3/0372* (2013.01)

(58) Field of Classification Search
CPC .................................................... H03K 3/0372
See application file for complete search history.

(56) References Cited

U.S. PATENT DOCUMENTS

| | | | | |
|---|---|---|---|---|
| 6,662,324 | B1 * | 12/2003 | Motika | G01R 31/31858 714/729 |
| 7,038,494 | B2 * | 5/2006 | Morton | G01R 31/318541 327/202 |
| 7,702,980 | B2 * | 4/2010 | Chen | G01R 31/318536 377/64 |
| 8,631,292 | B2 * | 1/2014 | Yang | G01R 31/318541 714/733 |
| 9,291,674 | B1 * | 3/2016 | Lu | G01R 31/3177 |
| 2005/0005214 | A1 * | 1/2005 | Ueda | G01R 31/318541 714/726 |
| 2006/0095819 | A1 * | 5/2006 | Bhatia | G01R 31/318541 714/726 |
| 2018/0026610 | A1 * | 1/2018 | Blutman | H03K 3/3562 327/203 |
| 2021/0126628 | A1 * | 4/2021 | Hong | H03K 3/0372 |
| 2025/0030407 | A1 * | 1/2025 | Peng | H03K 3/0372 |
| 2026/0095159 | A1 * | 4/2026 | Venugopal | H03K 3/037 |

* cited by examiner

*Primary Examiner* — Adam D Houston
(74) *Attorney, Agent, or Firm* — Slater Matsil, LLP

(57) ABSTRACT

In an implementation, a flip-flop circuit may include a master latch configured to receive and store input data. The flip-flop circuit may also include a slave latch coupled to the master latch and a clock gating circuit coupled between the master latch and the slave latch, where the clock gating circuit is configured to selectively enable or disable an internal gated clock signal to the slave latch based on a state of the master latch.

20 Claims, 6 Drawing Sheets

FLIP-FLOP CIRCUIT WITH SELECTIVE CLOCK GATING

BACKGROUND

Digital circuits are fundamental components of modern electronic systems, playing a crucial role in processing and storing information. As technology advances, there is an increasing demand for more efficient and power-conscious circuit designs, particularly in portable and battery-powered devices. Flip-flops, which are basic building blocks in sequential logic circuits, are widely used for storing and transferring data in synchronous digital systems. However, as the complexity and speed of digital systems continue to grow, managing power consumption and optimizing performance of these fundamental components becomes increasingly challenging.

BRIEF DESCRIPTION OF THE DRAWINGS

For a more complete understanding of the present disclosure, and the advantages thereof, reference is now made to the following descriptions taken in conjunction with the accompanying drawings.

Figure 1:
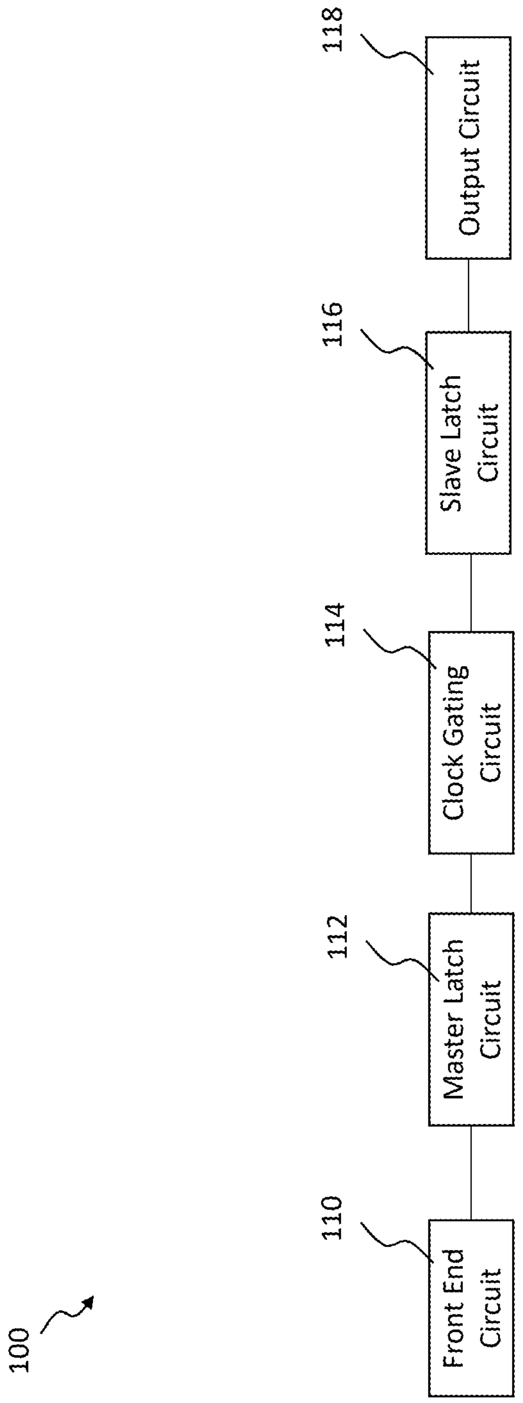
FIG. 1 illustrates a block diagram of a flip-flop system, in accordance with some implementations.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope.

Reference to "an implementation," "one implementation," "an embodiment," or "one embodiment" in the framework of the present description is intended to indicate that a particular configuration, structure, or characteristic described in relation to the implementation/embodiment is included in at least one implementation/embodiment. Hence, phrases such as "in one implementation" or "in one embodiment" that may be present in one or more points of the present description do not necessarily refer to one and the same implementation/embodiment. Moreover, particular conformations, structures, or characteristics may be combined in any adequate way in one or more implementations/embodiments. The references used herein are provided merely for convenience and hence do not define the extent of protection or the scope of the implementations/embodiments.

The present disclosure provides a flip-flop circuit designed to optimize power consumption, particularly in scenarios where the data stream contains a sequence of zeroes. In some implementations, this is achieved including a clock gate in the clock path of a master-slave flip-flop design, with the internal state acting as a gating signal. This design allows for the optimization of power consumption while maintaining the same activity factor (AF) across both flops.

The disclosed flip-flop circuit includes a master latch, a slave latch, and a clock gating circuit. The master latch is configured to receive and store input data. The slave latch, which is coupled to the master latch, updates its state based on the clock signal controlled by the clock gating circuit. The clock gating circuit is coupled between the master latch and the slave latch and is configured to selectively enable or disable the clock signal to the slave latch based on the state of the master latch. This selective clock gating allows for significant power savings, particularly when the data stream contains consecutive zeroes.

In some implementations, the clock gating circuit includes a logic gate, such as a NOR gate, which receives a feedback signal from the master latch and an input clock signal. The logic gate is configured to control the clock signal to the slave latch, thereby optimizing dynamic power consumption. The slave latch updates its state only when the clock gating circuit enables the clock signal, further contributing to power efficiency.

The disclosed flip-flop circuit may also include a multiplexer configured to select between a data input and a scan input based on a scan enable signal. This feature provides additional flexibility in the operation of the flip-flop circuit.

The disclosed flip-flop circuit offers several advantages over related flip-flop designs. Notably, it provides power efficiency, particularly in scenarios where the data AF is low with a stream of zeroes. This power efficiency can be significant, making the disclosed flip-flop circuit a valuable addition to the library of digital circuit designs and a useful component in achieving power goals for future electronic products.

Referring to FIG. 1, the figure illustrates a block diagram of a flip-flop system 100 according to various implementations. The flip-flop system 100 includes several interconnected components, such as a front-end circuit 110, a master latch circuit 112, a clock gating circuit 114, a slave latch circuit 116, and an output circuit 118.

The front-end circuit 110 is positioned at the beginning of the system and is connected to the master latch circuit 112. The master latch circuit 112 is then connected to the clock gating circuit 114. Following the clock gating circuit 114 is the slave latch circuit 116, which is connected to the output circuit 118.

The front-end circuit 110 receives input signals and prepares them for processing by the subsequent circuits. The master latch circuit 112 stores data in the low phase of the clock before the data may be passed to the slave latch circuit 116 depending on the clock gating circuit 114. The clock gating circuit 114 controls the timing and flow of data between the master and slave latches, reducing power consumption by selectively enabling or disabling clock signals. The slave latch circuit 116 holds the data for output, and the output circuit 118 buffers or conditions the final output signal.

The arrangement of these components in the flip-flop system 100 allows for data processing and storage, with the clock gating circuit 114 providing a mechanism for power-efficient operation. In some implementations, the flip-flop system 100 may be part of an integrated circuit that includes a plurality of such flip-flop circuits. Each flip-flop circuit in the integrated circuit may include a master latch, a slave latch, and a clock gating circuit configured to control a clock signal to the slave latch based on data stored in the master latch. This configuration can provide significant power savings, particularly in scenarios where the data stream contains consecutive zeroes.

For example, the power-saving advantages of the disclosed flip-flop circuit are relevant in several common digital design scenarios. In memory interface applications, such as data transfers between L2 and L3 cache levels, data streams frequently contain extended sequences of zeros during idle or low-activity periods. Similarly, in floating-point units, certain data paths may maintain zero values for significant portions of operation time, particularly in unused or inactive precision bits.

Another example is in shader units where certain bit positions may remain zero for extended periods while others maintain active switching patterns. This behavior is common in graphics processing scenarios where not all bits of a data path are continuously utilized. The disclosed flip-flop circuit is particularly well-suited for these scenarios, as it can automatically detect and respond to these zero-value patterns without requiring external control signals or additional complexity in the surrounding logic.

In some implementations, multiple flip-flop circuits as described herein may be arranged together to form a multi-bit circuit structure. For example, a plurality of the flip-flop circuits may be configured to handle different portions of a multi-bit data path, where different portions of the data path exhibit different switching behaviors. In such arrangements, a first group of the flip-flop circuits may operate on data bits that switch states frequently (having a first activity factor), while a second group of the flip-flop circuits may operate on data bits that switch states less frequently or maintain constant values for extended periods (having a second, lower activity factor). This arrangement is particularly beneficial in applications such as graphics processing units where certain data path bits are actively used while others remain unused for extended periods.

The power-saving features of each flip-flop circuit operate independently based on their individual input data patterns. For example, in a multi-bit data path, the flip-flop circuits handling frequently changing data bits will regularly update their states, while the flip-flop circuits handling infrequently changing data bits or constant zero values will automatically enter their power-saving modes. This independent operation allows power savings to be realized in portions of the data path that are less active, even while other portions maintain high activity levels. By matching the power consumption behavior to the actual data patterns of each bit position, the overall system can achieve improved power efficiency without requiring external control or configuration of individual flip-flop circuits.

Figure 2:
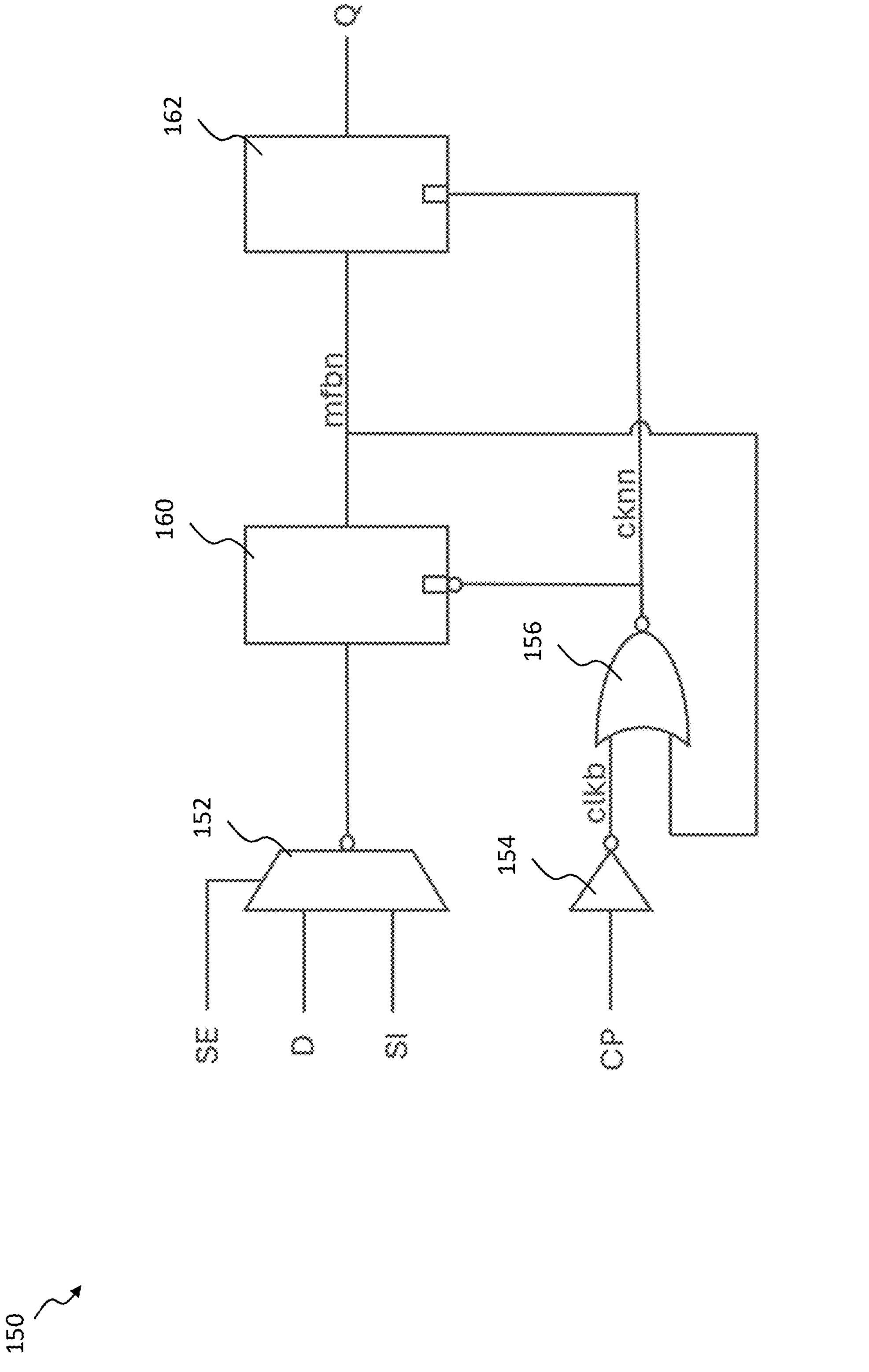
FIG. 2 illustrates a schematic of a flip-flop circuit, in accordance with some implementations.

Referring to FIG. 2, the figure illustrates a flip-flop system 150 designed for power-efficient operation according to various implementations. The flip-flop system 150 includes several interconnected components that work together to process and store data. The flip-flop system 150 is an implementation of the flip-flop system 100 in FIG. 1.

The flip-flop system 150 includes a multiplexer 152, a master latch 160, a slave latch 162, and a clock gating circuit comprising an inverter 154 and a logic gate 156. The multiplexer 152 is configured to receive a data input signal (D) and a scan input signal (SI), and selectively output one of these signals based on a scan enable signal (SE). This multiplexer configuration enables both normal operation and scan testing functionality within the flip-flop system.

The master latch 160 is coupled to receive the output from the multiplexer 152 and is configured to capture and store the selected input data. The master latch 160 includes a inverting clock input that receives an internally controlled clock signal (CKNN). The master latch 160 generates a feedback signal on a master feedback node (MFBN), which represents the inverse of the state stored in the master latch 160.

The clock gating circuit includes the inverter 154 and the logic gate 156, such as a NOR gate. The inverter 154 receives an input clock signal (CP) and generates and inverted clock signal CLKb. The logic gate 156 receives this inverter clock signal CLKb and the feedback signal MFBN from the master latch 160. In some implementations, the logic gate 156 performs a logical NOR operation on these inputs to generate the internally controlled clock signal (CKNN).

The slave latch 162 is coupled to receive data from the master latch 160 and is clocked by the internally controlled clock signal CKNN. The slave latch 162 provides the flip-flop output signal (Q). The operation of the slave latch 162 is controlled by the CKNN signal, which determines when the slave latch 162 can update its state based on the data from the master latch 160.

In operation, the feedback signal MFBN and the clock control circuit work together to implement a power-efficient clocking scheme. When the master latch 160 captures a logic '0', MFBN goes high, causing the NOR gate 156 to output a low CKNN signal regardless of CLKb, preventing the slave latch 162 from switching. During the clock phase when CP is low and consequently CLKb is high, the NOR gate 156 outputs a low CKNN signal, ensuring the slave latch 162 maintains its current state while the master latch 160 captures new data.

The internally controlled clock signal CKNN, generated by the logic gate 156, controls the data capture timing of the master latch 160 and the slave latch 162. When CP transitions from high to low, CLKb transitions from low to high, causing CKNN to go low. During this phase, since the master latch 160 has an inverting clock input, it is enabled to capture new data from the multiplexer 152 while the slave latch 162 holds its current state. When CP transitions from low to high and CLKb transitions from high to low, if MFBN is low, CKNN goes high, which disables the master latch 160 and enables the slave latch 162 to capture the data from master latch 160.

This implementation of clock gating through the combination of the inverter 154 and the logic gate 156, integrated directly within the flip-flop system 150, provides an efficient mechanism for reducing dynamic power consumption. When processing data streams containing consecutive zeros, MFBN remains high, causing CKNN to remain low and preventing unnecessary switching of the slave latch 162 during these periods.

The integration of the clock gating circuit within the flip-flop system 150 reduces the need for external clock gating components and further contributes to the compactness and power efficiency of the system. This integrated clock gating, combined with the master-slave latch configuration, provides a power-efficient solution for data storage and processing in digital circuits, particularly in scenarios where the data stream contains consecutive zeroes.

Figure 3:
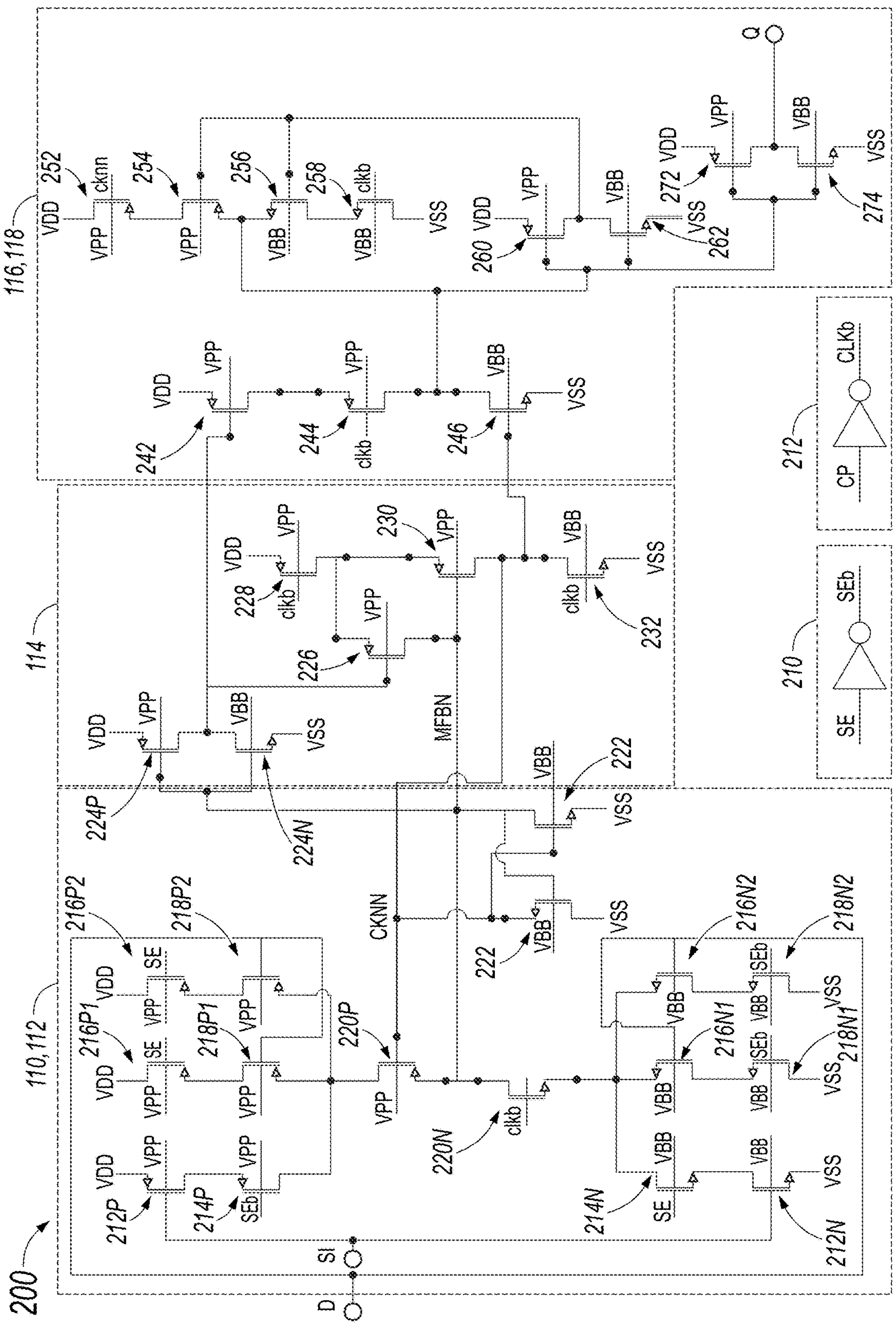
FIG. 3 illustrates a circuit diagram of a flip-flop system, in accordance with some implementations.

Referring to FIG. 3, the figure illustrates a circuit diagram 200 of a flip-flop system optimized for power savings when handling data streams containing consecutive zeros. The circuit diagram 200 comprises several sections: a front-end circuit 110, a master latch circuit 112, a clock gating circuit 114, a slave latch circuit 116, and an output circuit 118. The circuit diagram 200 also illustrates scan enable signals 210 and clock signals 212. Each section serves a specific purpose in achieving power efficiency while maintaining proper flip-flop functionality. The circuit diagram 200 is an implementation of the flip-flop system 150 in FIG. 2 and the flip-flop system 100 in FIG. 1.

The front-end circuit 110 of the circuit diagram 200 includes a multiplexer configuration implemented with PMOS transistors 212P, 214P, 216P1, 216P2, 218P1, and 218P2, as well as NMOS transistors 212N, 214N1, 216N2, 218N1, and 218N2. These transistors form the input circuit and are connected to receive both the data input (D) and scan input (SI) signals. The multiplexer structure allows selection between normal operation through the data input (D) and test mode operation through the scan input (SI), with the selection controlled by scan enable (SE) signals 210 (e.g., scan enable (SE) and inverted scan enable (SEb). The SE signals 210 as illustrated include the SE signal input to an inverter and the output being the SEb signal. The clock signals 212 as illustrated include the clock signal (CP) input to an inverter and the output being the inverted clock signal (CLKb). The SE signals are provided to specific transistors to control the multiplexing operation, enabling flexible switching between operational modes. The clock signals are provided to specific transistors to control the timing and flow of the operation of the circuit.

The master latch circuit 112 of the circuit diagram 200 comprises PMOS transistor 220P and NMOS transistor 220N, which are connected to a cross-coupled inverter 222. This configuration forms a storage element that captures and holds the selected input data. The master latch circuit 112 is controlled by the clock signal and generates the master feedback node (MFBN) signal, which represents the inverse of the stored state. The MFBN signal serves as a control signal for the power-saving features of the circuit, feeding into the clock gating logic to enable selective clock switching based on the stored data value.

The clock gating circuit 114 includes PMOS transistors 224P, 226, 230, and 242, along with NMOS transistors 224N, 228, and 232. These transistors are arranged to form a clock gating structure that generates the internally gated clock signal CKNN. The transistors 224P and 224N form an inverter that takes the MFBN signal as input, while transistors 226, 228, 230, and 232 are configured as a NOR gate. This arrangement creates the gating structure. The NOR gate's output produces the internally generated clock CKNN, which controls the slave latch's operation. A feedback path is created by connecting the MFBN signal back to the NOR gate input, establishing a control loop that enables power-efficient operation.

The clock gating circuit 114 enables a reduction of power consumption in flip-flop designs. In other master-slave flip-flops, the clock path may contain two inverters that switch every clock cycle, consuming power regardless of data activity. This design replaces one of these inverters into a gating element that responds to the data state, allowing the circuit to reduce unnecessary switching activity when handling streams of zeros. The integration of the clock gating circuit within the flip-flop system eliminates the need for external clock gating components, contributing to the compactness and overall power efficiency of the system.

The slave latch circuit 116 of circuit diagram 200 comprises PMOS transistors 242, 244, 252, 254, and 260, along with NMOS transistors 246, 256, 258, and 262. These transistors form two main functional blocks: a slave latch tri-state buffer (formed by transistors 242, 244, and 246) and a feedback loop (formed by transistors 252, 254, 256, 258, 260, and 262). The feedback loop includes an inverter (formed by transistors 260 and 262) and a feedback tri-state buffer (formed by transistors 252-258). The feedback tri-state buffer and the slave latch tri-state buffer operation are controlled by the internally generated clock signal CKNN, which determines when new data from the master latch can propagate through to the slave latch. The feedback inverter/buffer and the tri-state buffer maintain the stored state when the tri-state buffer is disabled, creating a stable storage element.

The output circuit 118 comprises of PMOS transistor 272 and NMOS transistor 274 configured as an inverter. This circuit buffers and generates the final output signal Q, providing sufficient drive strength for downstream logic while isolating the internal slave latch from external loading effects.

During normal operation, the circuit functions through several phases synchronized with the clock signal. When clock is low, the master latch is transparent and captures the selected input (D or SI) while the slave latch holds its previous state. When clock transitions high, the master latch becomes opaque, holding its state, and the slave latch may become transparent depending on the state of CKNN.

The power-saving operation of the circuit is controlled by on the interaction between MFBN and CKNN signals. When input data remains at zero for consecutive cycles, MFBN stays high, causing CKNN to remain low through the NOR gate configuration in the clock gating circuit 114. This prevents the master latch's and the slave latch's internal nodes from switching unnecessarily, reducing dynamic power consumption. The circuit maintains this power-saving state until new non-zero data arrives at the input.

The clock gating circuit 114 operates by monitoring the master latch state through MFBN. This design's NOR gate configuration enables selective clock propagation-when MFBN indicates stored zero values, the internal clock CKNN stops toggling, preventing unnecessary switching in the slave latch's transistors and associated nodes.

The slave latch updates occur only when CKNN enables the tri-state buffer. During power-saving mode (with consecutive zeros), the disabled tri-state buffer maintains the slave latch's state through its feedback inverter without requiring clock switching. This selective update substantially reduces internal power consumption compared to related designs that switch internal nodes every clock cycle regardless of data values.

The clock gating circuit 114 implements power-saving by combining the master latch state with the clock signal. When MFBN is high (indicating stored zero), the NOR gate configuration prevents clock propagation to CKNN. This design choice stems from the observation that in many applications, particularly shader units and memory interfaces, data streams often contain consecutive zeros. The circuit exploits this pattern to reduce switching power without requiring external clock gating logic.

TABLE 1

| D | Q_prev | CLKb | MFBN | CKNN | Q(next) | Notes |
|---|---|---|---|---|---|---|
| 0 | 0 | 0 | 1 | 0 | 0 | Hold state, power save |
| 0 | 0 | 1 | 1 | 0 | 0 | Capture 0 in master |
| 0 | 1 | 0 | 1 | 0 | 1 | Hold state |
| 0 | 1 | 1 | 1 | 0 | 1 | Capture 0 in master |
| 1 | 0 | 0 | 1 | 0 | 0 | Hold state |
| 1 | 0 | 1 | 0 | 1 | 0 | Capture 1 in master |
| 1 | 1 | 0 | 0 | 1 | 1 | Update slave to 1 |
| 1 | 1 | 1 | 0 | 0 | 1 | Capture 1 in master |

Table 1 illustrates the state transitions and operating modes of the power-efficient flip-flop through various input conditions. The table tracks the relationships between input D, previous output Q_prev, clock (CLKb), master feedback node (MFBN), internal gated clock (CKNN), and next state output Q (next).

Measurement data demonstrates the effectiveness of this power-saving approach across various activity factors (AF). For the 128-bit stream, when comparing the circuit to related master-slave flip-flops, we see the following results for total power: With consecutive zeros (AF=0), the circuit achieves a 26.76% reduction in total power consumption, while with consecutive ones (AF=0), it shows a 13.86% power increase. At intermediate activity factors, the savings vary: −3.77% at AF=50%, −0.17% at AF=25%, +2.50% at AF=12.5%, and +5.85% at AF=1/128.

For internal power, the improvements are even more pronounced: 39.43% reduction with consecutive zeros, though there's an 18.29% increase with consecutive ones. The internal power savings show a consistent trend across activity factors: −3.55% at AF=50%, +1.05% at AF=25%, +4.83% at AF=12.5%, and +10.06% at AF=1/128.

In an 8-bit shader unit example, two operating modes were tested. In F8 mode where all 8 bits have the same AF (Bits 7-0=AF), the results mirror the general 128-bit stream pattern. However, in F4 mode (Bits 7-4=AF1 & Bits 3-0=AF2), where half the bits remain at zero, significant power savings are achieved: 7.35% when AF1=50%, 11.17% when AF1=25%, 13.59% when AF1=12.5%, and reaching 16.24% when AF1=1/128 (with AF2=0 in all cases). These results validate the design's ability to reduce power consumption in real-world applications where data patterns include extended sequences of zeros, with the greatest benefits seen at lower activity factors and when portions of the data remain static.

The clock gating circuit 114 achieves its power savings through selective disabling of the internal clock rather than through external clock gating. This approach provides advantages over traditional solutions that might implement clock gating through separate comparison logic and external gates. Attempting to implement similar functionality through external gating would require additional comparator circuits, increasing both area and complexity.

Alternative approaches might consider implementing clock gating through external circuitry. However, such external implementations would require additional comparison logic to detect when the incoming data matches the currently stored state. This external comparator circuitry would need to monitor both the input data and current state continuously, leading to increased area overhead and design complexity. Furthermore, the additional circuitry in the clock path could impact timing characteristics and potentially require more complex clock tree synthesis to manage clock skew.

The present implementation avoids these drawbacks by integrating the gating function directly within the flip-flop's clock path, utilizing the existing master latch state node. This integrated approach achieves the desired power savings while minimizing both area impact and timing complexity. The conversion of an existing clock inverter into a gating element provides an elegant solution that maintains the original timing characteristics of the master-slave flip-flop while adding the power-saving functionality.

Implementation results demonstrate the circuit's effectiveness across different operating conditions. Performance analysis shows (see, e.g., FIG. 4) that during sequences of consecutive zeros, peak current draw reduces from approximately 120 microamps to 60 microamps. This reduction in current spikes directly translates to power savings, which can be important in modern high-performance designs where sequential elements contribute significantly to overall power consumption.

Figure 4:
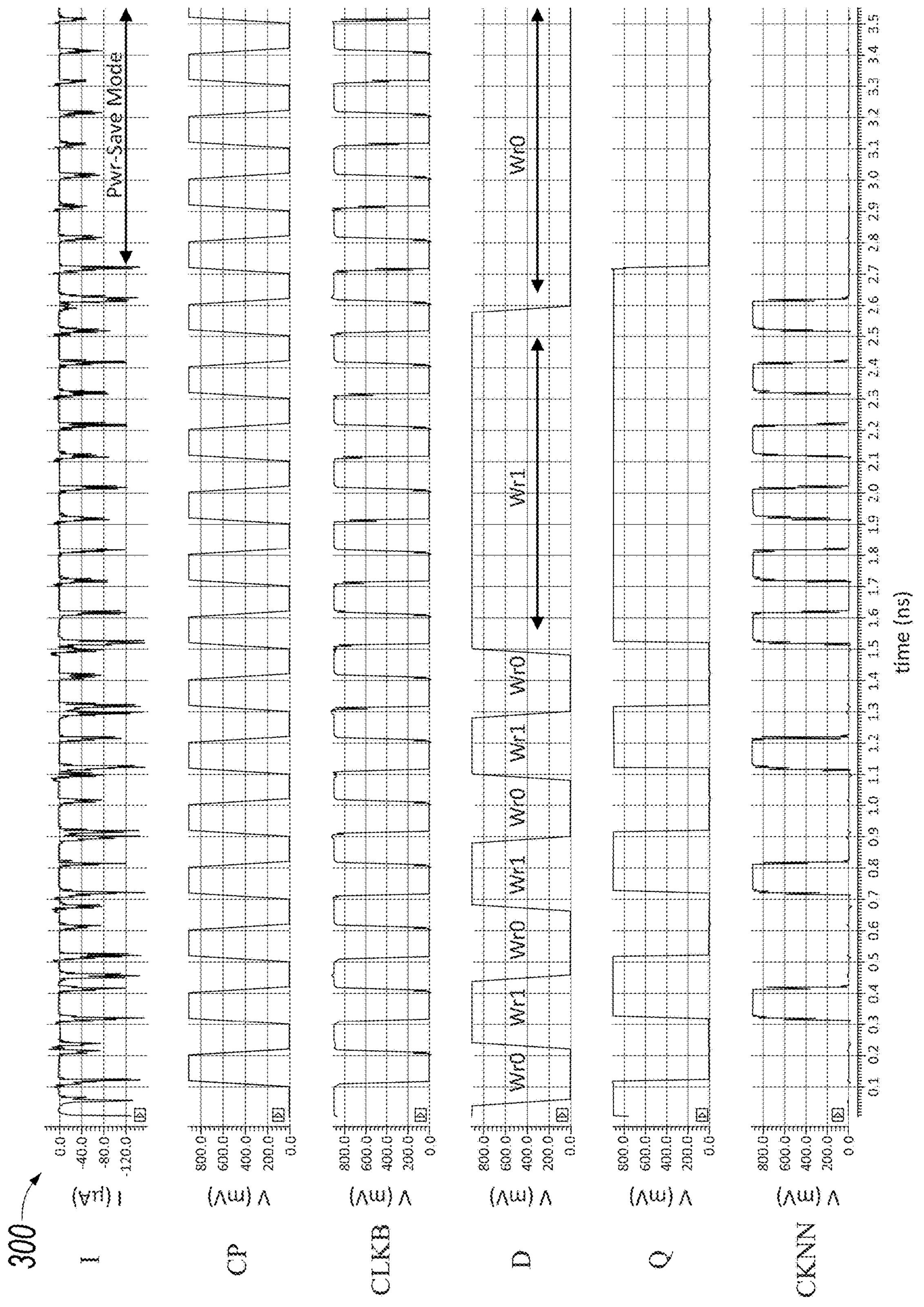
FIG. 4 illustrates a waveform diagram illustrating the operation of a flip-flop circuit, in accordance with some implementations.

Referring to FIG. 4, the figure illustrates a waveform diagram 300 demonstrating the operation of a flip-flop circuit. The waveform diagram displays six signals that characterize the circuit's behavior: supply current (I), clock (CP), inverted clock (CLKb), data input (D), output (Q), and the internally generated clock (CKNN). These traces are plotted against time measured in nanoseconds, showing both normal operation and power-saving modes.

The supply current trace (I), shown at the top of the diagram, reveals the dynamic power consumption characteristics of the circuit. During active switching periods where data transitions between Wr0 (Write 0) and Wr1 (Write 1), the current shows regular high-amplitude spikes of approximately 120 microamps. When the circuit enters power-save mode, indicated on the right portion of the waveform, these current spikes reduce to approximately 60 microamps and occur less frequently, demonstrating the power-saving effectiveness of the design.

The clock signal (CP) and its inverse (CLKb) maintain consistent square wave patterns throughout the measurement period. CP oscillates between 0V and 800 mV with a 50% duty cycle, while CLKb provides the complementary waveform needed for proper flip-flop operation. These clock signals continue to toggle even during power-save mode, highlighting that power savings come from internal circuit operation rather than external clock gating.

The data input signal (D) shows two distinct patterns of operation. In the left portion of the waveform, D alternates between Wr0 and Wr1 states (0V and 800 mV) every few clock cycles, representing active data switching. The right portion shows extended periods where D remains constant (first at Wr1, then at Wr0), demonstrating conditions where power-saving features become active.

The output signal (Q) follows the data input with appropriate clock-edge synchronization. The waveform demonstrates clean transitions and proper hold behavior during both active switching and power-save modes. During power-save mode, Q maintains its state without unnecessary transitions, contributing to power efficiency.

The internally generated clock signal (CKNN), displayed at the bottom of the diagram, exhibits the power-saving behavior of the circuit. During active data switching periods (left side), CKNN generates pulses synchronized with the main clock. However, when D remains constant at zero (Wr0), CKNN stops toggling completely, indicating that the clock gating circuit has activated. This behavior directly relates to the reduced current consumption shown in the supply current trace.

The power-save mode, explicitly labeled on the right portion of the diagram, demonstrates how the circuit responds to consecutive zeros in the data stream. When D transitions to Wr0 and remains there, CKNN ceases toggling, the output Q maintains a stable low state, and supply current spikes reduce in both frequency and magnitude. This mode activates automatically based on the data pattern, requiring no external control signals.

The waveforms also reveal the timing relationships between signals. Clock-to-output delays can be observed in the relationship between CP edges and Q transitions during active operation. The CKNN signal shows appropriate setup and hold timing margins relative to the main clock, ensuring reliable data capture and propagation.

The transition between normal operation and power-save mode occurs smoothly, with no glitches or unwanted state changes. When data transitions from active switching to constant zero, the circuit enters power-save mode within one clock cycle. This seamless mode transition maintains data integrity while achieving power savings.

Figure 5:
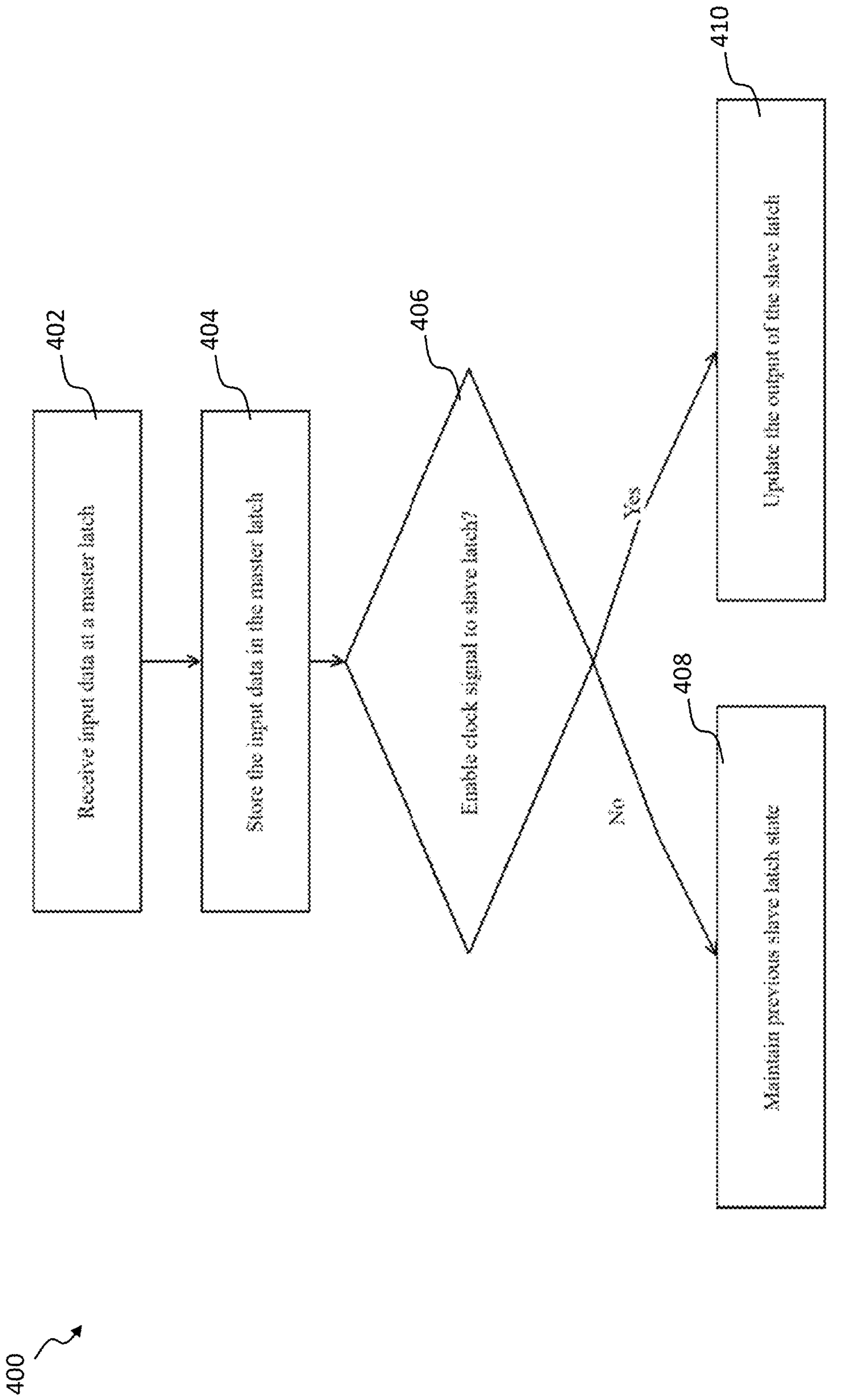
FIG. 5 illustrates a flowchart of a process for operating a flip-flop circuit, in accordance with some implementations.

Referring to FIG. 5, the figure illustrates a process 400 for operating a flip-flop circuit according to various implementations.

The process begins with receiving input data at a master latch (step 402). In some cases, the input data may be a binary signal, such as a stream of zeroes and ones, that needs to be stored and processed. The master latch, which may be part of a master latch circuit such as master latch circuit 112 in FIG. 1 or master latch 160 in FIG. 2, is configured to receive and store this input data. The master latch may include a pair of cross-coupled inverters for data retention, as shown in FIG. 3.

Once the input data is received, the process involves storing the input data in the master latch (step 404). The master latch captures the input data on the rising edge of the clock signal CLKb, as shown in the waveform diagram 300 in FIG. 4. The stored data in the master latch is then used to generate a feedback signal, which is fed back to the clock gating circuit.

The next step in the process involves selectively enabling or disabling a clock signal to a slave latch based on the state of the master latch (step 406). This decision point is a part of the power-saving feature of the flip-flop circuit. The clock gating circuit, which may be part of a clock gating circuit such as clock gating circuit 114 in FIG. 1, is configured to control the clock signal to the slave latch based on the state of the master latch. If the state of the master latch indicates that the input data has not changed, the clock gating circuit disables the clock signal to the slave latch, thereby preventing unnecessary switching and saving power (step 408).

If the clock signal is enabled, the process proceeds to update the output of the slave latch (step 410). The slave latch, which may be part of a slave latch circuit such as slave latch circuit 116 in FIG. 1 or slave latch 162 in FIG. 2, updates its state on the falling edge of the clock signal CLKb, but only when the internally generated clock signal CKNN is active. The slave latch includes a transmission gate that is controlled by the enabled clock signal from the clock gating circuit. When CKNN goes high, the input transmission gate in the slave latch opens, allowing data from the master latch to enter. When CKNN goes low, the transmission gate closes, and the new data is latched. Using this described process, the flip-flop circuit can effectively reduce power consumption, particularly in scenarios where the data stream contains consecutive zeroes.

Figure 6:
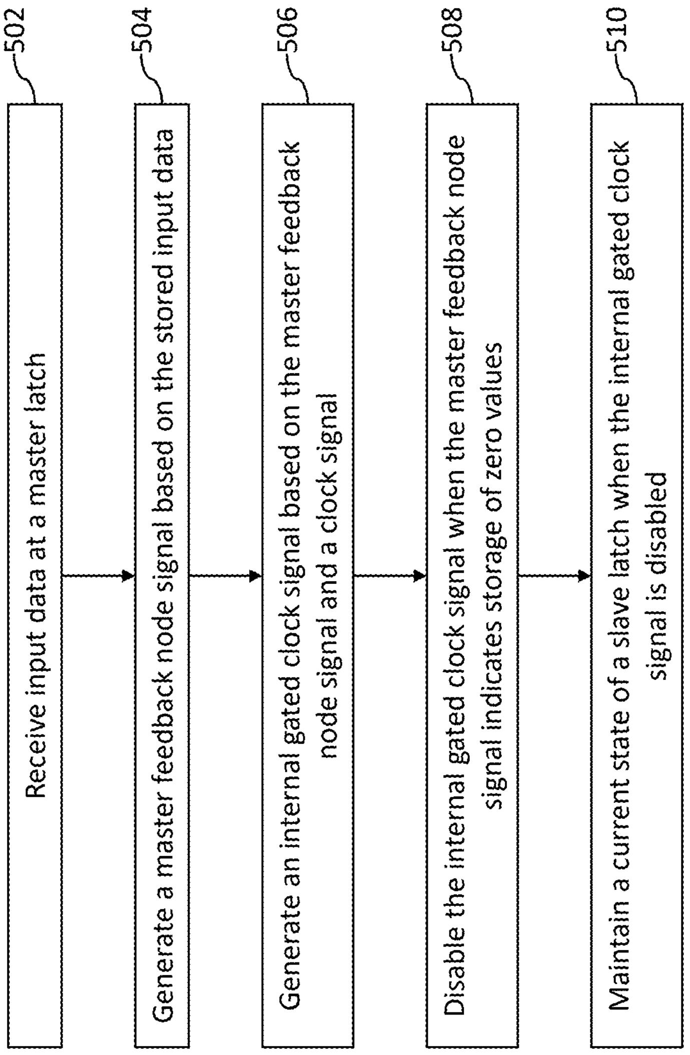
FIG. 6 illustrates a flowchart of a method for operating a flip-flop circuit, in accordance with some implementations.

FIG. 6 is a flowchart of an example process 500. In some implementations, one or more process steps of FIG. 6 may be performed by a flip-flop circuit.

As shown in FIG. 6, process 500 may include receiving input data at a master latch (step 502). For example, flip-flop circuit may receive input data at a master latch, as described above. The process 500 may include generating a master feedback node signal based on the stored input data (step 504). For example, flip-flop circuit may generate a master feedback node signal based on the stored input data, as described above. The process 500 may include generating an internal gated clock signal based on the master feedback node signal and a clock signal (step 506). For example, flip-flop circuit may generate an internal gated clock signal based on the master feedback node signal and a clock signal, as described above. The process 500 may include disabling the internal gated clock signal when the master feedback node signal indicates storage of zero values (step 508). For example, flip-flop circuit may disable the internal gated clock signal when the master feedback node signal indicates storage of zero values, as described above. The process 500 may include maintaining a current state of a slave latch when the internal gated clock signal is disabled (step 510). For example, flip-flop circuit may maintain a current state of a slave latch when the internal gated clock signal is disabled, as described above.

Although FIG. 6 shows example steps of process 500, in some implementations, process 500 may include additional steps, fewer steps, different steps, or differently arranged steps than those depicted in FIG. 6. Additionally, or alternatively, two or more of the steps of process 500 may be performed in parallel.

The present disclosure provides a flip-flop circuit designed to optimize power consumption, particularly in scenarios where the data stream contains a sequence of zeroes. The flip-flop circuit includes a master latch, a slave latch, and an integrated clock gating circuit. The master latch is configured to receive and store input data and generate a master feedback node signal. The slave latch is coupled to the master latch and updates its state based on an internal gated clock signal controlled by the clock gating circuit. The integrated clock gating circuit is coupled between the master latch and the slave latch and is configured to selectively enable or disable the internal gated clock signal based on the master feedback node signal, allowing for significant power savings particularly when handling consecutive zeroes. Multiple flip-flop circuits may be arranged together to form a multi-bit circuit structure, where different groups of flip-flop circuits operate with different activity factors, enabling power savings in less active portions of a data path while maintaining full operation in more active portions. This configuration provides a power-efficient solution for modern digital circuit applications such as graphics processing units, memory interfaces, and floating-point units.

In an implementation, a flip-flop circuit may include a master latch configured to receive and store input data. The flip-flop circuit may also include a slave latch coupled to the master latch and a clock gating circuit coupled between the master latch and the slave latch, where the clock gating circuit is configured to selectively enable or disable an internal gated clock signal to the slave latch based on a state of the master latch.

The described implementations may also include one or more of the following features. The flip-flop circuit where the clock gating circuit may include a logic gate, the logic gate having a first input configured to receive a master feedback node signal from the master latch and a second input configured to receive an input clock signal. The flip-flop circuit where the logic gate is configured to generate the internal gated clock signal for the slave latch, and maintain the internal gated clock signal in a disabled state through multiple clock cycles when the master feedback node signal indicates storage of consecutive zero values. The flip-flop circuit where the clock gating circuit is configured to enable the internal gated clock signal when the master latch captures a logic one value, and disable the internal gated clock signal when the master latch captures a logic zero value. The flip-flop circuit where the slave latch may include a tri-state buffer controlled by the internal gated clock signal, and a feedback inverter configured to maintain a stored state when the tri-state buffer is disabled. The flip-flop circuit where the master latch is configured to generate the master feedback node signal as an inverse of the stored input data, and provide the master feedback node signal to the clock gating circuit. The flip-flop circuit may include a multiplexer configured to select between a data input and a scan input based on a scan enable signal.

In an implementation, a method of operating a flip-flop circuit may include receiving input data at a master latch, generating a master feedback node signal based on stored input data, and generating an internal gated clock signal based on the master feedback node signal and a clock signal. The method may also include disabling the internal gated clock signal when the master feedback node signal indicates storage of zero values, and maintaining a state of a slave latch when the internal gated clock signal is disabled.

The described implementations may also include one or more of the following features. The method where generating the master feedback node signal may include storing the input data in the master latch using cross-coupled inverters, and outputting an inverse of the stored input data as the master feedback node signal. The method where generating the internal gated clock signal may include receiving the master feedback node signal at a first input of a logic gate, receiving the clock signal at a second input of the logic gate, and performing a logical NOR operation on the master feedback node signal and the clock signal to generate the internal gated clock signal. The method may include enabling the internal gated clock signal when the master latch captures a logic one value, updating the state of the slave latch in response to the enabled internal gated clock signal, and passing the stored input data from the master latch to the slave latch through a transmission gate controlled by the enabled internal gated clock signal. The method where maintaining the state of the slave latch may include disabling a tri-state buffer in the slave latch using the disabled internal gated clock signal, and maintaining the state using a feedback inverter in the slave latch. The method may include selecting between a data input and a scan input based on a scan enable signal before receiving the input data at the master latch, and providing the selected input to the master latch. The method may include maintaining the internal gated clock signal in a disabled state when the master feedback node signal indicates consecutive zero values in the input data, and reducing power consumption in the slave latch by preventing clock switching during the consecutive zero values.

In an implementation, a digital circuit system may include a flip-flop circuit. The flip-flop circuit having a master latch configured to store input data and generate a master feedback node signal indicating a stored data state. The flip-flop circuit may also include an integrated clock gating circuit configured receive the master feedback node signal and a clock signal, generate an internal gated clock signal based on the master feedback node signal and the clock signal, and disable the internal gated clock signal during consecutive clock cycles when the master feedback node signal indicates storage of zero values. The flip-flop circuit may also include a slave latch configured to receive the internal gated clock signal and maintain a current output state when the internal gated clock signal is disabled.

The described implementations may also include one or more of the following features. The digital circuit system where the master feedback node signal is an inverse of the stored input data, and the integrated clock gating circuit may include a NOR gate configured to generate the internal gated clock signal as a logical NOR of the master feedback node signal and the clock signal, and maintain the internal gated clock signal in a low state when the master feedback node signal is in a high state indicating storage of a zero value. The digital circuit system where the slave latch may include a tri-state buffer controlled by the internal gated clock signal, a feedback inverter coupled to an output of the tri-state buffer, and where the tri-state buffer is configured to pass data from the master latch when the internal gated clock signal is enabled, and enter a high impedance state when the internal gated clock signal is disabled, allowing the feedback inverter to maintain the current output state. The digital circuit system where the flip-flop circuit is configured to maintain the internal gated clock signal enabled and update the slave latch when the master latch captures a logic one value, and maintain the internal gated clock signal disabled and prevent slave latch updating when the master latch captures and maintains a logic zero value. The digital circuit system may include a plurality of flip-flop circuits, the flip-flop circuit being one of the plurality of flip-flop circuits, where the plurality of flip-flop circuits are configured in a multi-bit arrangement having a first group of flip-flops operating with a first activity factor, and a second group of flip-flops operating with a second activity factor lower than the first activity factor, where power consumption is reduced in the second group of flip-flops. The digital circuit system where the master latch may include cross-coupled inverters for data retention, the integrated clock gating circuit may include a logic gate positioned to receive the master feedback node signal, and the slave latch may include a transmission gate controlled by the internal gated clock signal for selectively passing data from the master latch.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular implementations described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding implementations described herein. Accordingly, the appended claims are intended to include within their scope such processes, machines, manufacture, compositions of matter, means, methods, or steps.

What is claimed is:

1. A flip-flop circuit, comprising:

a master latch configured to receive and store input data;

a slave latch coupled to the master latch; and a clock gating circuit coupled between the master latch and the slave latch, wherein the clock gating circuit is configured to selectively enable or disable an internal gated clock signal to the slave latch based on a state of the master latch.

2. The flip-flop circuit of claim 1, wherein the clock gating circuit comprises a logic gate, the logic gate having a first input configured to receive a master feedback node signal from the master latch and a second input configured to receive an input clock signal.

3. The flip-flop circuit of claim 2, wherein the logic gate is configured to:

generate the internal gated clock signal for the slave latch; and maintain the internal gated clock signal in a disabled state through multiple clock cycles when the master feedback node signal indicates storage of consecutive zero values.

4. The flip-flop circuit of claim 1, further comprising a multiplexer configured to select between a data input and a scan input based on a scan enable signal.

5. The flip-flop circuit of claim 2, wherein the master latch is configured to:

generate the master feedback node signal as an inverse of the stored input data; and provide the master feedback node signal to the clock gating circuit.

6. The flip-flop circuit of claim 3, wherein the clock gating circuit is configured to:

enable the internal gated clock signal when the master latch captures a logic one value; and disable the internal gated clock signal when the master latch captures a logic zero value.

7. The flip-flop circuit of claim 6, wherein the slave latch comprises:

a tri-state buffer controlled by the internal gated clock signal; and a feedback inverter configured to maintain a stored state when the tri-state buffer is disabled.

8. A method of operating a flip-flop circuit, comprising:

receiving input data at a master latch;

generating a master feedback node signal based on stored input data;

generating an internal gated clock signal based on the master feedback node signal and a clock signal;

disabling the internal gated clock signal when the master feedback node signal indicates storage of zero values; and maintaining a state of a slave latch when the internal gated clock signal is disabled.

9. The method of claim 8, wherein generating the master feedback node signal comprises:

storing the input data in the master latch using cross-coupled inverters; and outputting an inverse of the stored input data as the master feedback node signal.

10. The method of claim 8, wherein generating the internal gated clock signal comprises:

receiving the master feedback node signal at a first input of a logic gate;

receiving the clock signal at a second input of the logic gate; and performing a logical NOR operation on the master feedback node signal and the clock signal to generate the internal gated clock signal.

11. The method of claim 8, further comprising:

enabling the internal gated clock signal when the master latch captures a logic one value;

updating the state of the slave latch in response to the enabled internal gated clock signal; and passing the stored input data from the master latch to the slave latch through a transmission gate controlled by the enabled internal gated clock signal.

12. The method of claim 8, wherein maintaining the state of the slave latch comprises:

disabling a tri-state buffer in the slave latch using the disabled internal gated clock signal; and maintaining the state using a feedback inverter in the slave latch.

13. The method of claim 8, further comprising:

selecting between a data input and a scan input based on a scan enable signal before receiving the input data at the master latch; and providing the selected input to the master latch.

14. The method of claim 8, further comprising:

maintaining the internal gated clock signal in a disabled state when the master feedback node signal indicates consecutive zero values in the input data; and reducing power consumption in the slave latch by preventing clock switching during the consecutive zero values.

15. A digital circuit system, comprising:

a flip-flop circuit comprising:

a master latch configured to:

store input data; and generate a master feedback node signal indicating a stored data state;

an integrated clock gating circuit configured to:

receive the master feedback node signal and a clock signal;

generate an internal gated clock signal based on the master feedback node signal and the clock signal; and disable the internal gated clock signal during consecutive clock cycles when the master feedback node signal indicates storage of zero values; and a slave latch configured to:

receive the internal gated clock signal; and maintain a current output state when the internal gated clock signal is disabled.

16. The digital circuit system of claim 15, wherein:

the master feedback node signal is an inverse of the stored input data; and the integrated clock gating circuit comprises a NOR gate configured to:

generate the internal gated clock signal as a logical NOR of the master feedback node signal and the clock signal; and maintain the internal gated clock signal in a low state when the master feedback node signal is in a high state indicating storage of a zero value.

17. The digital circuit system of claim 15, wherein the slave latch comprises:

a tri-state buffer controlled by the internal gated clock signal;

a feedback inverter coupled to an output of the tri-state buffer; and wherein the tri-state buffer is configured to:

pass data from the master latch when the internal gated clock signal is enabled; and enter a high impedance state when the internal gated clock signal is disabled, allowing the feedback inverter to maintain the current output state.

18. The digital circuit system of claim 15, wherein the flip-flop circuit is configured to:

maintain the internal gated clock signal enabled and update the slave latch when the master latch captures a logic one value; and maintain the internal gated clock signal disabled and prevent slave latch updating when the master latch captures and maintains a logic zero value.

19. The digital circuit system of claim 15, further comprising a plurality of flip-flop circuits, the flip-flop circuit being one of the plurality of flip-flop circuits, wherein the plurality of flip-flop circuits are configured in a multi-bit arrangement comprising:

a first group of flip-flops operating with a first activity factor; and a second group of flip-flops operating with a second activity factor lower than the first activity factor, wherein power consumption is reduced in the second group of flip-flops.

20. The digital circuit system of claim 15, wherein:

the master latch comprises cross-coupled inverters for data retention;

the integrated clock gating circuit comprises a logic gate positioned to receive the master feedback node signal; and the slave latch comprises a transmission gate controlled by the internal gated clock signal for selectively passing data from the master latch.

* * * * *